United States Patent
Wu et al.

(10) Patent No.: US 10,768,530 B2
(45) Date of Patent: Sep. 8, 2020

(54) DEVELOPING APPARATUS AND DEVELOPING METHOD THEREOF

(71) Applicants: HEFEI BOE DISPLAY TECHNOLOGY CO., LTD., Anhui (CN); BOE TECHNOLOGY GROUP CO., LTD., Beijing (CN)

(72) Inventors: Kefang Wu, Beijing (CN); Wei Zhou, Beijing (CN); Jiarong Xu, Beijing (CN); Yunwei Li, Beijing (CN); Chaogun Wang, Beijing (CN); Zhenyu Wang, Beijing (CN); Yuandan Chen, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/342,905

(22) PCT Filed: Jul. 19, 2018

(86) PCT No.: PCT/CN2018/096326
§ 371 (c)(1),
(2) Date: Apr. 17, 2019

(87) PCT Pub. No.: WO2019/042039
PCT Pub. Date: Mar. 7, 2019

(65) Prior Publication Data
US 2019/0258167 A1    Aug. 22, 2019

(30) Foreign Application Priority Data

Sep. 1, 2017 (CN) .......................... 2017 1 0780192

(51) Int. Cl.
*G03B 5/00* (2006.01)
*G03F 7/32* (2006.01)
(Continued)

(52) U.S. Cl.
CPC .............. *G03F 7/32* (2013.01); *G03F 7/3042* (2013.01); *G03F 7/3057* (2013.01); *G03F 7/3071* (2013.01); *G03G 15/2053* (2013.01)

(58) Field of Classification Search
USPC ......................................................... 396/611
See application file for complete search history.

(56) References Cited

U.S. PATENT DOCUMENTS

| 7,215,350 B2 * | 5/2007 | Torisawa | ........... G03G 15/2021 347/140 |
| 10,545,435 B2 * | 1/2020 | Uchiyama | .......... G03G 15/2039 |

(Continued)

FOREIGN PATENT DOCUMENTS

| CN | 101650530 A | 2/2010 |
| CN | 104281015 A | 1/2015 |

(Continued)

OTHER PUBLICATIONS

International Search Report and Written Opinion issued in corresponding PCT/CN2018/096326, dated Sep. 12, 2018, with English translation.

(Continued)

*Primary Examiner* — Rodney E Fuller
(74) *Attorney, Agent, or Firm* — McDermott Will & Emery LLP (57) ABSTRACT

A developing apparatus includes a developing mechanism and a heating mechanism, and the heating mechanism includes a plurality of heating units. The plurality of heating (Continued)

units are provided above or below the developing mechanism, and each heating unit of the plurality of heating units is disposed independently.

12 Claims, 5 Drawing Sheets

(51) Int. Cl.
  *G03G 15/20* (2006.01)
  *G03F 7/30* (2006.01)

(56) References Cited

U.S. PATENT DOCUMENTS

| | | | | |
|---|---|---|---|---|
| 2002/0146657 | A1* | 10/2002 | Anderson | B23K 1/008 432/11 |
| 2008/0142500 | A1* | 6/2008 | Tomita | H01L 21/67109 219/444.1 |
| 2011/0189602 | A1 | 8/2011 | Tadokoro et al. | |
| 2018/0218925 | A1* | 8/2018 | Shigetomi | H01L 21/67103 |
| 2019/0121266 | A1* | 4/2019 | Ando | G03G 15/2039 |
| 2019/0258167 | A1 | 8/2019 | Wu et al. | |

FOREIGN PATENT DOCUMENTS

| | | |
|---|---|---|
| CN | 105116695 A | 12/2015 |
| CN | 107092168 A | 8/2017 |
| CN | 107422609 A | 12/2017 |
| CN | 107479339 A | 12/2017 |
| JP | 2009-194242 A | 8/2009 |
| JP | 4954642 B2 | 6/2012 |

OTHER PUBLICATIONS

First Office Action issued in corresponding Chinese Application No. 201710780192.6, dated Apr. 26, 2019, with English translation.

* cited by examiner

DEVELOPING APPARATUS AND DEVELOPING METHOD THEREOF

CROSS-REFERENCE OF RELATED APPLICATIONS

This application is a national phase entry under 35 USC 371 of International Patent Application No. PCT/CN2018/096326 filed on Jul. 19, 2018, which claims priority to Chinese Patent Application No. 201710780192.6, filed on Sep. 1, 2017, titled "DEVELOPING APPARATUS AND DEVELOPING METHOD THEREOF", which are incorporated herein by reference in their entirety.

TECHNICAL FIELD

The present disclosure relates to the field of manufacturing display products, and specifically, to a developing apparatus and a developing method thereof.

BACKGROUND

Photoetching patterning process is a common process when manufacturing patterns on a substrate. The photoetching patterning process, manufacturing patterns of a pixel electrode is taken as an example, comprises: depositing a conductive material layer and a photoresist layer successively exposing the photoresist; developing the exposed photoresist, so as to retain the photoresist in a pixel eletrode region and remove the photoresist in other regions; etching a portion of the conductive material layer not covered by the photoresist; removing the remaining photoresist.

In an actual production, when developing the photoresist on a substrate, development speeds of different regions are inconsistent due to restrictions of process conditions, thus key sizes of patterns finally obtained are inconsistent, and then the product quality is affected.

SUMMARY

Some embodiments of the present disclosure provide a developing apparatus, including a developing mechanism and a heating mechanism, wherein, the heating mechanism includes a plurality of heating units. The plurality of heating units are provided above or below the developing mechanism, and each heating unit of the plurality of heating units is disposed independently.

In some embodiments, the developing mechanism is configured to develop the substrate to be developed. Each heating unit of the plurality of heating units corresponds to at least one of developing regions of the substrate to be developed, and different heating units correspond to different developing regions.

In some embodiments, the developing apparatus further includes a control mechanism coupled to each heating unit, wherein, the control mechanism is configured to, when the developing mechanism develops the substrate to be developed, turn on one or more heating units corresponding to an abnormal region according to a location of the abnormal region on the substrate to be developed, so as to heat the abnormal region.

In some embodiments, the developing mechanism includes a transmission component and a developing liquid output component. The transmission component is configured to transfer the substrate to be developed. The developing liquid output component includes a developing liquid outlet, the developing liquid outlet is disposed above the transmission component, and is configured to spray developing liquid onto the substrate to be developed which is located on the transmission component. The heating mechanism is located above the transmission component, and is located on a side of the developing liquid outlet in a first direction, the first direction is the direction in which the transmission component transfers the substrate to be developed.

In some embodiments, the control mechanism includes:

a processor, which is configured to acquire a target heating time according to a mapping relationship. The mapping relationship is a mapping relationship between a dispersion of the pattern size retained after a sample substrate of the same type as the substrate to be developed is developed and a heating time of an abnormal region on the sample substrate; the target heating time is a heating time corresponding to a smallest dispersion.

a memory, which is configured to store the mapping relationship.

a timer, which is configured to control each heating unit corresponding to the abnormal region to heat the abnormal region according to the target heating time.

In some embodiments, the plurality of heating units are arranged along a direction cross the first direction, and each heating unit includes a plurality of heating elements which are arranged along the first direction. The first direction is the direction in which the transmission component transfers the substrate to be developed.

The timer is further configured to: a) calculate a target quantity of the heating elements in each heating unit for heating the abnormal region according to the target heating time, a transmission speed of the transmission component to transfer the substrate to be developed and a heating width of each heating element on the substrate to be developed. The heating width is a size of a heating region of the heating element on the substrate to be developed in the first direction. b) select the heating elements according to the abnormal region with the target quantity in each heating unit corresponding to the abnormal region as the target heating elements.

In some embodiments, the timer is further configured to: calculate an opening time at which each target heating element should be turned on according to the transmission speed of the transmission component to transfer the substrate to be developed and a distance from the abnormal region to each target heating element when the substrate to be developed is in the initial position; and calculate a closing time at which each target heating element should be turned off according to a size of the abnormal region in the first direction.

The timer further includes a switch. The switch is configured to control corresponding target heating elements to be turned on according to the opening time of each target heating element; and control corresponding target heating elements to be turned off according to the closing time of each target heating element.

In some embodiments, the initial position is located on a side of the developing liquid outlet opposite to the first direction.

The developing apparatus further includes a position detecting device, which is configured to detect whether the substrate to be developed arrives the initial position.

In some embodiments, the processor is further configured to: A) set a plurality of sample heating times in advance, each sample heating time corresponds to one sample substrate of the same type as the substrate to be developed. B) acquire a pattern size of each sample substrate retained after development. During a development course of each sample substrate, the abnormal region of each sample substrate is heated, and the heating time of each abnormal region corresponds to a sample heating time respectively. C) calculate a dispersion of the pattern size of each sample substrate retained after development according to the acquired pattern size, so as to acquire the mapping relationship.

In some embodiments, the heating element is an infrared radiation lamp.

Some embodiments of the present disclosure provide a developing method of the above-mentioned developing apparatus, which includes: spraying developing liquid onto the substrate to be developed by the developing mechanism; heating an abnormal region of the substrate to be developed by the heating mechanism, so that development speeds of developing regions of the substrate to be developed are the same.

In some embodiments, the developing mechanism includes a transmission component and a developing liquid output component. The developing liquid output component includes a developing liquid outlet, the developing liquid outlet is disposed above the transmission component; the heating mechanism is located above the transmission component, and is located on a side of the developing liquid outlet in the first direction.

Based on this, heating the abnormal region of the substrate to be developed by the heating mechanism, includes:

acquiring a target heating time according to a mapping relationship; the mapping relationship is a mapping relationship between a dispersion of the pattern size retained after a sample substrate of the same type as the substrate to be developed is developed and a heating time of the abnormal region of the sample substrate, the target heating time is a heating time corresponding to a smallest dispersion.

controlling each heating unit corresponding to the abnormal region to heat the abnormal region according to the target heating time.

In some embodiments, the plurality of heating units of the heating mechanism are arranged along a direction cross the first direction, and each heating unit includes a plurality of heating elements which are arranged along the first direction.

Based on this, controlling each heating unit corresponding to the abnormal region to heat the abnormal region according to the target heating time includes:

calculating a target quantity of the heating elements in each heating unit for heating the abnormal region according to the target heating time, a transmission speed of the transmission component to transfer the substrate to be developed and a heating width of each heating element on the substrate to be developed; wherein, the heating width is a size of a heating region of the heating element on the substrate to be developed in the first direction.

selecting the heating elements according to the abnormal region with the target quantity in each heating unit corresponding to the abnormal region as the target heating elements.

calculating an opening time at which each target heating element should be turned on according to the transmission speed of the transmission component to transfer the substrate to be developed and a distance from the abnormal region to each target heating element when the substrate to be developed is in the initial position; and calculating a closing time at which each target heating element should be turned off according to a size of the abnormal region in the first direction.

controlling corresponding target heating elements to be turned on according to the opening time of each target heating element; and controlling corresponding target heating elements to be turned off according to the closing time of each target heating element.

In some embodiments, before heating the abnormal region of the substrate to be developed by the heating mechanism, the developing method further includes:

providing a plurality of sample substrates of the same type as the substrate to be developed, and setting a plurality of sample heating times, each sample heating time corresponds one sample substrate.

developing each sample substrate, and heating the abnormal region of each sample substrate during a development course, the heating time is a sample heating time corresponding to the abnormal region of each sample substrate.

acquiring a pattern size of each sample substrate retained after development.

calculating a dispersion of the pattern size of each sample substrate retained after development, so as to acquire the mapping relationship.

In some embodiments, the heating mechanism adopts a method of infrared radiation.

Some embodiments of the present disclosure provide anon-transitory computer-readable storage medium, which stores computer instructions executed by a processor, the computer instructions are configured to execute the above-mentioned developing method.

BRIEF DESCRIPTION OF THE DRAWINGS

The accompanying drawings are used to provide further understanding of the present disclosure and constitute a part of the present disclosure. The drawings and the following detailed description serve to explain the present disclosure, but do not constitute a limitation to the present disclosure. In the drawings.

DETAILED DESCRIPTION

Some embodiments of the present disclosure will be described detailed with reference to the accompanying drawings as follows. It should be understood that, embodiments described herein are for illustrative purposes only and are not intended to limit the present disclosure.

Figure 1:
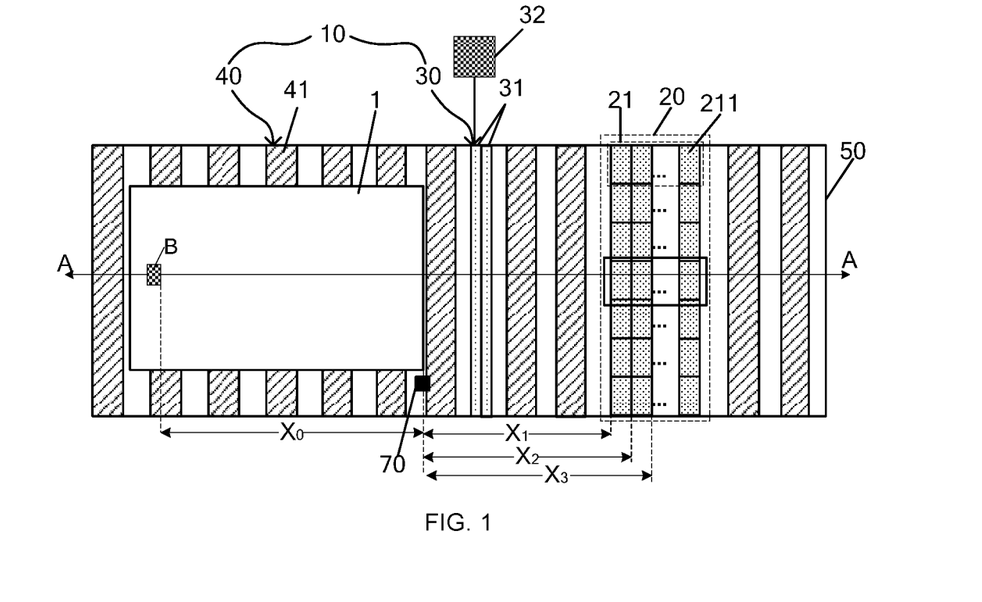
FIG. 1 is a plan view of a developing apparatus according to some embodiments of the present disclosure.
Figure 2:
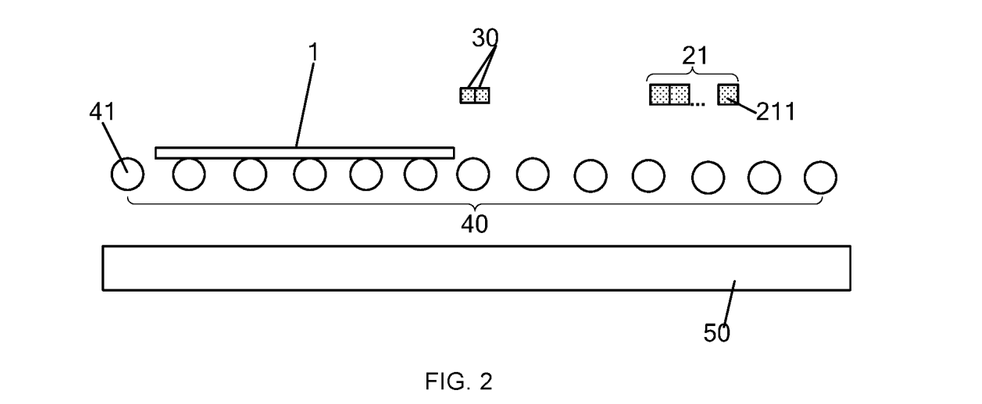
FIG. 2 is a sectional view along line A-A of FIG. 1.

Some embodiments of the present disclosure provide a developing apparatus, as shown in FIG. 1 and FIG. 2, which includes a developing mechanism 10 and a heating mechanism 20. The heating mechanism 20 includes a plurality of heating units 21. The plurality of heating units 21 are provided above or below the developing mechanism 10, and each heating unit 21 of the plurality of heating units 21 is disposed independently.

It should be understood that, the developing mechanism 10 is configured to develop the substrate 1 to be developed (it can also be called a substrate). When the developing mechanism 10 is adopted for developing the substrate 1 to be developed, each heating unit 21 of the plurality of heating units 21 corresponds to at least one of developing regions of the substrate 1 to be developed, different heating units 21 correspond to different developing regions, and the plurality of heating units 21 may be disposed independently.

That "each heating unit 21 of the plurality of heating units 21 corresponds to at least one of developing regions of the substrate 1 to be developed" means, one heating unit 21 may heat at least one of developing regions of the substrate 1 to be developed. That "each heating unit 21 of the plurality of heating units 21 is disposed independently" means, a status of turning on or turning off, a heating time, a heating temperature of any one heating unit 21 of the plurality of heating units 21 are all controlled independently.

When the heating mechanism 20 heats at least one of developing regions of the substrate 1 to be developed, in some embodiments, the plurality of heating units 21 in the heating mechanism 20 are not relatively fixed in position with respect to the developing regions of the substrate 1 to be developed which is heated by the plurality of heating units 21. For example, only one row or one column of heating units 21 is fixedly disposed with respect to the developing mechanism 10, since the developing mechanism 10 may move the substrate 1 to be developed along a column direction or a row direction, the one row or one column of heating units 21 may heat at least one of developing regions of the substrate 1 to be developed during movement of the substrate 1 to be developed.

Certainly, in some embodiments, the plurality of heating units 21 are relatively fixed in position with respect to the substrate 1 to be developed. For example, a plurality of heating units 21 are arranged in multiple rows and columns, and are fixedly disposed above the substrate 1 to be developed, and each heating unit 21 corresponds to a developing region below it.

When temperatures of every developing region of the substrate 1 to be developed are the same, development speeds (i.e. reaction speeds of photoresist and developer) of different developing regions may be different subject to different process environments and different distribution densities of patterns to be formed, thus sizes of patterns finally obtained are different.

However, in the developing apparatus provided by some embodiments of the present disclosure, since the heating mechanism 20 is provided, and each heating unit 21 of the heating mechanism 20 may be controlled independently, when a development speed of certain one developing region is slow (that is, sizes of patterns finally obtained are large), the development speed of this developing region may be accelerated by controlling corresponding one or several heating units 21 to heat this developing region. And development speed of this developing region and development speeds of other developing regions will tend to be uniform by controlling parameters such as heating time or heating temperature of each heating unit 21, thus uniformity of sizes of the patterns formed after development is improved.

In some embodiments, the developing mechanism 10 includes a transmission component 40 and a developing liquid output component 30.

As shown in FIG. 1 and FIG. 2, the transmission component 40 is configured to transfer the substrate 1 to be developed. In some embodiments, the transmission component 40 includes a plurality of transmission rollers 41.

As shown in FIG. 1 and FIG. 2, the developing liquid output component 30 includes developing liquid outlets 31. The developing liquid outlets 31 are disposed above the transmission component 40, and are configured to spray developing liquid onto the substrate 1 to be developed which is located on the transmission component 40.

In some embodiments, the developing liquid output component 30 may further includes a storage container 32 and nozzles communicated with the storage container 32, spouts of the nozzles are the developing liquid outlets 31. The nozzles may be arranged in one or more columns, each column of the nozzles should covers the whole substrate 1 to be developed in a width direction (a direction perpendicular to a direction in which the transmission component 40 transfers the substrate 1 to be developed) of the substrate 1 to be developed.

In some embodiments, as shown in FIG. 1 and FIG. 2, a recovery tank 50 may further be disposed below the transmission component 40 to recover the developing liquid.

The heating mechanism 20 is located above the transmission component 40, and is located on a side of the developing liquid outlets 31 in a first direction. The first direction is a direction in which the transmission component 40 transfers the substrate 1 to be developed. In some embodiments, the first direction is a left-to-right direction in FIG. 1 and FIG. 2, the heating mechanism 20 is located on right side of the developing liquid outlets 31.

Figure 10:
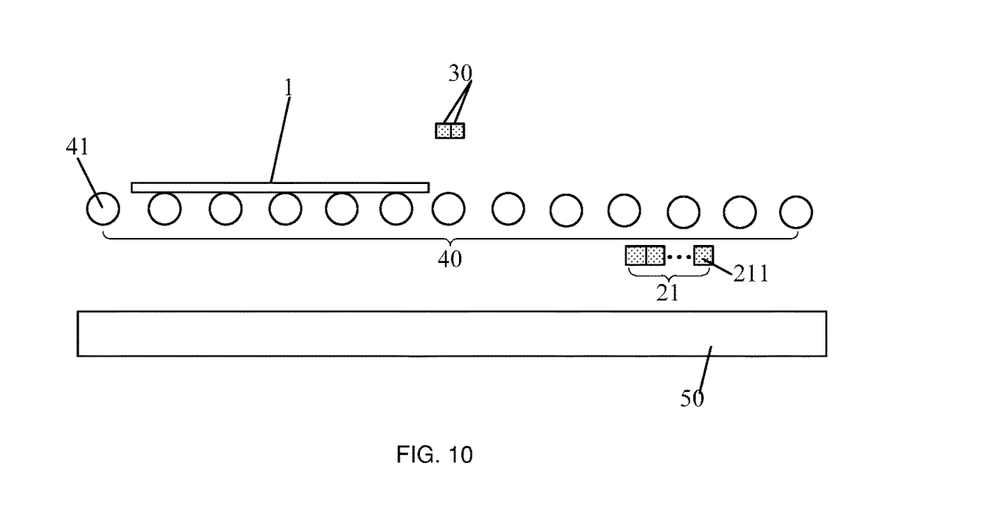
FIG. 10 is another sectional view along line A-A of FIG. 1.

When the substrate 1 to be developed is transferred under the developing liquid outlets 31, the developing liquid is sprayed onto the substrate 1 to be developed, thus the photoresist on the substrate 1 to be developed is developed. When the substrate 1 to be developed continues to be transferred under the heating mechanism 20, a development speed of an abnormal region B may be improved by heating of one or more heating units 21 in the heating mechanism 20. Disposing the heating mechanism 20 above the transmission component 40 may prevent the developing liquid from flowing onto the heating mechanism 20 and damaging the heating mechanism 20. Despite all this, in some embodiments, as shown in FIG. 10, the heating mechanism 20 is located below the transmission component 40.

In some embodiments, the plurality of heating units 21 of the heating mechanism 20 are arranged along a direction cross the first direction. In some embodiments, a direction along which the plurality of heating units 21 are arranged is perpendicular to the first direction. As shown in FIG. 1, the plurality of heating units 21 of the heating mechanism 20 are arranged in a direction from top to bottom.

In some embodiments, as shown in FIG. 1 and FIG. 2, each heating unit 21 includes a plurality of heating elements 211 which are arranged in the first direction. The heating element 211 is an infrared radiation lamp.

Figure 3:
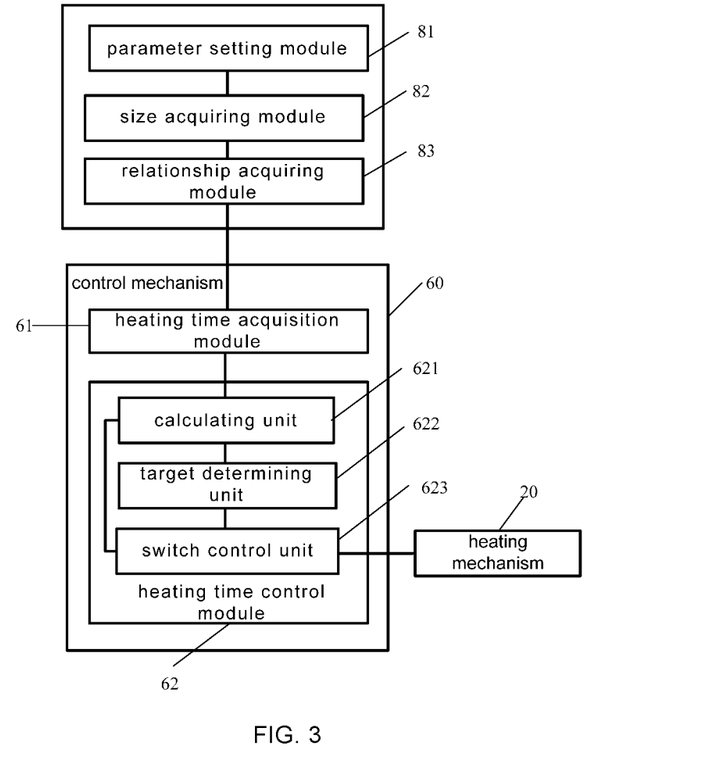
FIG. 3 is a schematic diagram showing a connection relationship of modules for controlling a heating mechanism in the developing apparatus.

In order to achieve an automatic control of each heating unit 21, as shown in FIG. 3, in some embodiments, the developing apparatus further includes a control mechanism 60 coupled to each heating unit 21. The control mechanism 60 is configured to, when the developing mechanism 10 develops the substrate 1 to be developed, turn on one or more heating units 21 corresponding to an abnormal region B according to a location of the abnormal region B (as shown in FIG. 1) on the substrate 1 to be developed, so as to heat the abnormal region B. It should be understood that "more heating units 21" refers to at least two heating units 21.

The abnormal region B is a pre-acquired region of the substrate 1 to be developed, this region corresponds to a region (on a substrate of the same type as the substrate 1 to be developed) within which a pattern size retained after the substrate of the same type is developed is larger than a target size, in a case where the substrate of the same type is not heated by the heating mechanism 20.

The abnormal region B is acquired in a case where a substrate of the same type is developed under a same development process as the substrate 1 to be developed without being heated by the heating mechanism 20.

That is, under a same development process with the substrate 1 to be developed, and in a case where a substrate of the same type as the substrate 1 to be developed is not heated, that a pattern size obtained after development (i.e., a size of the retained photoresist) in one or some regions on the substrate of the same type is larger than a target size indicates a development speed of the one or some regions is too slow, then the region(s) where development speed is too slow is region(s) corresponding to the abnormal region B. In this case, when the substrate 1 to be developed is developed, the development speed of the abnormal region B may be increased by heating of the one or more heating units 21 corresponding to the abnormal region B.

In an actual production, when substrates with the same batch and the same type are developed in a same development process, locations of the abnormal regions B on the substrates are basically the same. Therefore, a location of an abnormal region may be obtained in advance by testing one or several substrates in one batch without heating them by the heating mechanism 20, and the location is taken as a location of the abnormal region B of all the substrates in this batch.

It should be noted that, the pattern size refers to a pattern size of the photoresist retained after development.

In some embodiments of the present disclosure, the pattern size is regarded as a key size of the pattern formed after etching. That is, the pattern size is consistent with the key size of the pattern formed after etching. For example, when developing the substrate 1 to be developed then to form a signal line such as a gate line, a data line via a subsequent etching process, the pattern size is a width of the signal line. Another example, when developing the substrate 1 to be developed then to form a pixel electrode via a subsequent etching process, the pattern size is a length and/or a width of the pixel electrode. Yet another example, when developing the substrate 1 to be developed then to form a gate electrode via a subsequent etching process, the pattern size is a length and/or a width of the gate electrode. Yet another example, when developing the substrate 1 to be developed then to form a source electrode and a drain electrode via a subsequent etching process, the pattern size is a length and/or a width of the source electrode and the drain electrode.

In an actual production, taking an array substrate as an example, for patterns of components (such as gate lines, data lines, pixel electrodes, gate electrodes, source electrodes and drain electrodes, etc.) to be formed on the array substrate, there is a standard range of the pattern size of the developed photoresist. When pattern sizes of the developed photoresist in each developing region are all in the standard range, pattern sizes of components finally formed in different regions may all satisfy the production requirement, and uniformity is also acceptable.

In some embodiments, the target size may be the maximum value of the standard range.

In some embodiments, it is possible that a pattern size after development in an actual production is smaller than the the minimum value of the standard range. With regard to these regions, their pattern sizes after development may be enlarged by adjusting exposure quantity in an exposure step before the development process.

In some embodiments, as shown in FIG. 3, the control mechanism 60 includes a heating time acquisition module 61 and a heating time control module 62.

The heating time acquisition module 61 is configured to acquire a target heating time according to a mapping relationship. The mapping relationship is a mapping relationship between a dispersion of a pattern size retained after a sample substrate of the same type as the substrate 1 to be developed is developed and a heating time of the abnormal region B on the sample substrate. The target heating time is a heating time corresponding to a smallest dispersion. The mapping relationship may be acquired by developing a plurality of sample substrates before developing the substrate to be developed.

It should be understood that, the smaller the dispersion of the pattern sizes retained after development, the higher the uniformity. In order to accurately represent the dispersion, the heating time acquisition module 61 takes, three times of the standard deviation ($3\sigma$) of the pattern size retained after development of the sample substrate of the same type as the substrate 1 to be developed, as the dispersion.

Figure 4:
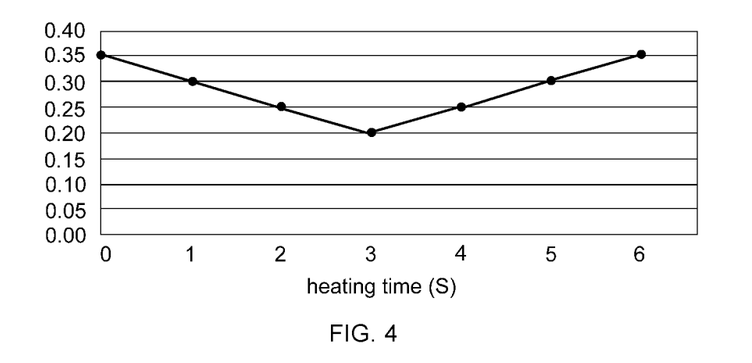
FIG. 4 is a graph showing a mapping relationship between a dispersion of the pattern size obtained after development and a heating time of an abnormal region of the substrate according to some embodiments of the present disclosure.

FIG. 4 is a graph of the mapping relationship. The horizontal axis represents the heating time of the abnormal region B of the substrate 1 to be developed, and the vertical axis represents the dispersion. It can be known from FIG. 4 that, when the heating time is three seconds, three times of the standard deviation ($3\sigma$) of the pattern size retained after development is smallest (i.e. the dispersion is smallest). That is, when heating the abnormal region B for 3 s, development speed of the abnormal region B and those of the other developing regions tend to be uniform, and the uniformity of the pattern sizes after development is best.

The heating time control module 62 is configured to control each heating unit 21 corresponding to the abnormal region B to heat the abnormal region B according to the target heating time. Thereby, the dispersion of the pattern size retained after development is minimized, and the uniformity of the pattern size is improved.

In some embodiments, as shown in FIG. 3, the heating time control module 62 includes a calculating unit 621 and a target determining unit 622.

The calculating unit 621 is configured to calculate a target quantity of heating elements 211 in each heating unit 21 for heating the abnormal region B according to a target heating time, a transmission speed of the transmission component 40 to transfer the substrate 1 to be developed and a heating width of each heating element 211 on the substrate 1 to be developed. The heating width is a size of a heating region heated by the heating element 211 on the substrate 1 to be developed in the first direction.

It should be understood that, the heating region of each heating element 211 on the substrate 1 to be developed does not overlap with each other.

Since an area of the abnormal region B is small, and in order to facilitate calculation of the calculating unit 621, the heating mechanism 20 begins to heat the abnormal region B when the abnormal region B completely enters the heating range of the heating mechanism 20. And the heating mechanism 20 stops heating the abnormal region B when the abnormal region B completely leaves the heating range of the heating mechanism 20.

In some embodiments, the transmission speed of the transmission component 40 to transfer the substrate 1 to be developed is V. Each heating unit 21 includes N (N is a positive integer greater than 1) heating elements 211, and the heating width of each heating element 211 on the substrate 1 to be developed is D. Based on this, when the plurality of heating elements 211 of each heating unit 21 are all turned on, the heating time $T_1$ of each heating unit 21 for the abnormal region is N×D/N ($T_1$=N×D/N). When the target heating time acquired according to the above preset mapping relationship is $T_2$, the target quantity n of the heating elements 211 is V×$T_2$/D (n=V×$T_2$/D).

The target determining unit 622 is configured to select, according to the abnormal region B, the heating elements 211 with the target quantity as the target heating elements in each heating unit 21 corresponding to the abnormal region B.

The target determining unit 622 determines, according to a location of the abnormal region B on the substrate 1 to be developed and a location of the substrate 1 to be developed on the transmission component 40, the abnormal region B to be transfered under which heating unit 21 of the plurality of heating units 21, and selects the heating elements 211 with the target quantity from the determined heating unit 21.

It should be noted that, when the heating elements 211 with a target quantity are selected in each heating unit 21 corresponding to the abnormal region B, the manner of selection is not limited, as long as the quantity of the selected heating elements 211 is the target quantity. In some embodiments, when the heating elements 211 with a target quantity are selected in each heating unit 21, they are sequentially selected in the first direction. For example, the abnormal region B of the substrate 1 to be developed passes by one heating unit 21 in a solid line frame in FIG. 1, and the target quantity is 3. In this case, the target determining unit 622 takes the left three heating elements 211 in the heating unit 21 as the target heating elements. In some embodiments, when the heating elements 211 with a target quantity are selected in each heating unit 21, they are selected at intervals. In some embodiments, when the heating elements 211 with a target quantity are selected in each heating unit 21, they are sequentially selected in an opposite direction of the first direction.

After the target heating elements are determined, the target heating elements are turned on when the abnormal region B of the substrate 1 to be developed enters the heating range of the target heating elements. And the target heating elements are turned off when the abnormal region B leaves the heating range of the target heating elements.

The production efficiency is improved as a result that the control mechanism 60 automatically controls the turning on and off of the target heating elements.

In some embodiments, the calculating unit 621 is further configured to, according to a transmission speed of the transmission component 40 to transfer the substrate 1 to be developed, and a distance from the abnormal region B to each target heating element when the substrate 1 to be developed is in an initial position, calculate an opening time at which each target heating element should be turned on; and calculate a closing time at which each target heating element should be turned off according to the size of the abnormal region B in the first direction.

It should be noted that, the distance from the abnormal region B to each target heating element when the substrate 1 to be developed is in an initial position is: the distance between each target heating element and an edge of the abnormal region B close to the each target heating element, when the substrate 1 to be developed is in an initial position. The distance can be determined according to a distance between the initial position and the target heating element, and the location of the abnormal region B on the substrate 1. The initial position is located on a side of the developing liquid outlet 31 opposite to the first direction.

As shown in FIG. 3, the heating time control module 62 further includes a switch control unit 623. The switch control unit 623 is configured to control corresponding target heating elements to be turned on according to the opening time of each target heating element, and to control corresponding target heating elements to be turned off according to the closing time of each target heating element.

In some embodiments, a width of the abnormal region B is d. A heating unit which can heat the abnormal region B is the heating unit 21 indicated in the solid line frame in FIG. 1, and the three heating elements 211 from left to right in this heating unit 21 are selected as the target heating elements corresponding to the abnormal region B. A transmission speed of the substrate 1 to be developed is V. When the substrate 1 to be developed is in the initial position, the distance from the abnormal region B to each target heating element is $X_0+X_1$, $X_0+X_2$, $X_0+X_3$ respectively. A heating width of each heating element is D. Based on this, the opening times $t_1$, $t_2$, $t_3$ of the three target heating elements from left to right are $t_1=(X_0+X_1)/V$, $t_2=(X_0+X_2)/V$, $t_3=(X_0+X_3)/V$ respectively. The closing times $t_1'$, $t_2'$, $t_3'$ of the three target heating elements are $t_1'=(d/V)+t_1$, $t_2'=(d/V)+t_2$, $t_3'=(d/V)+t_3$ respectively.

In some embodiments, the developing apparatus further includes a position detecting device, which is configured to detect whether the substrate 1 to be developed arrives the initial position. In some embodiments, as shown in FIG. 1, the position detecting device includes a sensor 70, the sensor 70 is located on a side of the developing liquid outlet 31 opposite to the first direction. When an edge of the substrate 1 to be developed arrives the position where the sensor 70 is located, the substrate 1 to be developed is detected by the sensor 70, and then determines the position of the substrate 1 to be developed as the initial position.

In some embodiments, as shown in FIG. 3, the developing apparatus further includes a parameter setting module 81, a size acquiring module 82 and a relationship acquiring module 83. The parameter setting module 81 is configured to set a plurality of sample heating times in advance, each sample heating time corresponds to a sample substrate of the same type as the substrate 1 to be developed. The size acquiring module 82 is configured to acquire a pattern size of each sample substrate retained after development. During a development course of each sample substrate, the abnormal region in the sample substrate is heated, and the heating time is the corresponding sample heating time. It should be understood that, heating may be performed by the above-mentioned heating elements 211 during heating. The relationship acquiring module 83 is configured to calculate a dispersion (i.e. 3σ, three times of the standard deviation) of the pattern size of each sample substrate retained after development according to the pattern sizes acquired by the size acquiring module 82, so as to acquire a relationship between a heating time and a dispersion of the pattern sizes retained after development, i.e. the mapping relationship.

Figure 5:
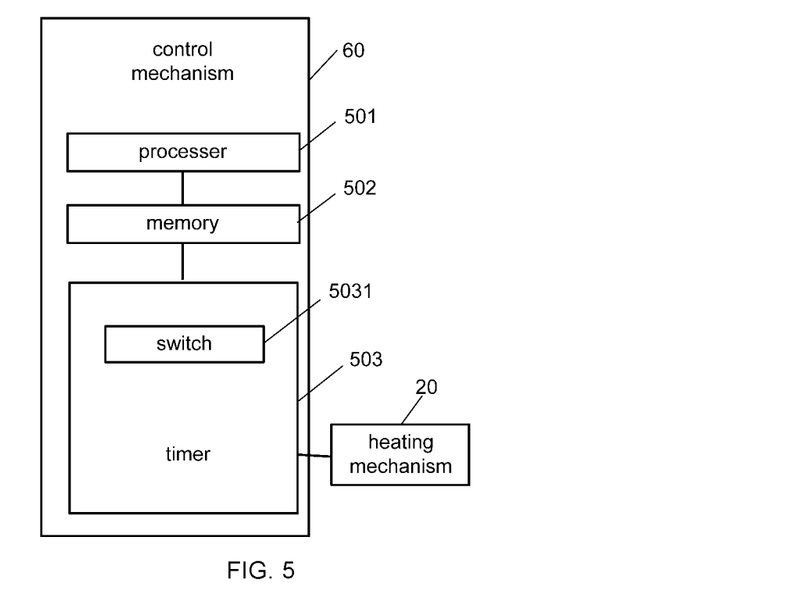
FIG. 5 is a schematic diagram showing a connection relationship of physical parts for controlling a heating mechanism in the developing apparatus.

As shown in FIG. 5, some embodiments of the present disclosure further provide a control mechanism 60, which includes a processor 501, a memory 502 and a timer 503.

the processor 501, which is configured to acquire a target heating time according to a mapping relationship.

The mapping relationship is a mapping relationship between a dispersion of a pattern size retained after a sample substrate of the same type as the substrate to be developed is developed and a heating time of the abnormal region on the sample substrate; the target heating time is a heating time corresponding to a smallest dispersion.

the memory 502, which is configured to store the mapping relationship.

the timer 503, which is configured to control one or more heating units corresponding to the abnormal region to heat the abnormal region according to the target heating time.

Based on the developing apparatus shown in FIG. 5, the plurality of heating units 21 are arranged in a direction cross the first direction (the first direction is a direction along which the transmission component 40 transfers the substrate 1 to be developed), and each heating unit 21 includes a plurality of heating elements 211 which are arranged in the first direction. The timer 503 is further configured to: a) calculate a target quantity of the heating elements 211 in each heating unit 21 for heating the abnormal region B according to the target heating time, the transmission speed of the transmission component 40 to transfer the substrate 1 to be developed and the heating width of each heating element 211 on the substrate 1 to be developed; wherein, the heating width is a size of the heating region of the heating element 211 on the substrate 1 to be developed in the first direction. b) select the heating elements 211 with the target quantity in each heating unit 21 corresponding to the abnormal region B as the target heating elements according to the abnormal region B.

Furthermore, the timer 503 is further configured to: according to a transmission speed of the transmission component 40 to transfer the substrate 1 to be developed, and the distance from the abnormal region B to each target heating element when the substrate 1 to be developed is in an initial position, calculate an opening time at which each target heating element should be turned on; and calculate a closing time at which each target heating element should be turned off, according to the size of the abnormal region B in the first direction.

The timer 503 further includes a switch 5031, the switch 5031 is configured to control corresponding target heating elements to be turned on according to the opening time of each target heating element; and control corresponding target heating elements to be turned off according to the closing time of each target heating element.

Furthermore, besides being configured to acquire the target heating time, the processor 501 is further configured to: A) preset a plurality of sample heating times, each sample heating time corresponds one sample substrate of the same type as the substrate 1 to be developed; B) acquire a pattern size of each sample substrate retained after development; wherein, during the development course of each sample substrate, the abnormal region in the sample substrate is heated, and the heating time is the corresponding sample heating time; C) calculate a dispersion of the pattern size of each sample substrate retained after development according to the acquired pattern sizes, so as to acquire the mapping relationship.

In some embodiments, the processor 501 may include any suitable processing or calculating device configured to perform one or more operations. For example, the processor 501 may include a single chip computer, a microprocessor, a microcontroller, a digital signal processor, a field programmable gate array or an application specific integrated circuit.

In some embodiments, the timer 503 is a timer with calculating and processing capacities. For example, functions of the above-mentioned timer 503 may be realized by integrating a single chip computer in a conventional timer.

Figure 6:
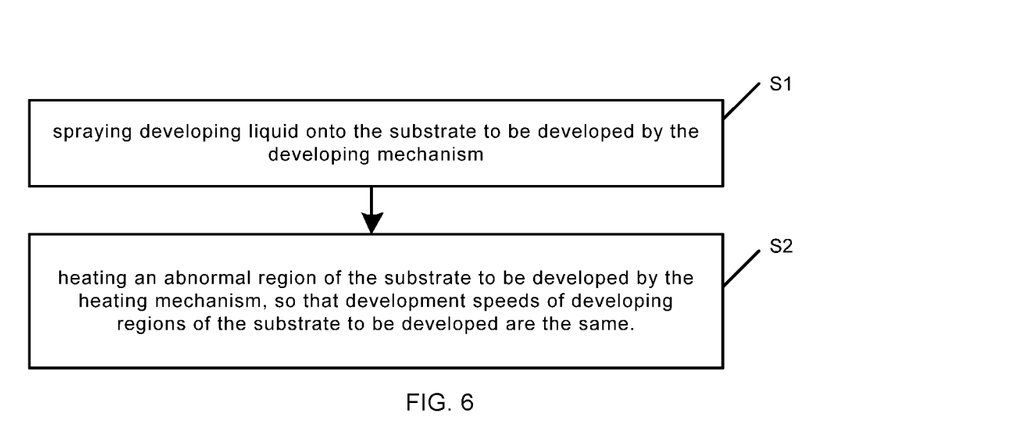
FIG. 6 is a flow chart of a developing method according to some embodiments of the present disclosure.

Some embodiments of the present disclosure provide a developing method using the above developing apparatus, as shown in FIG. 6, the developing method includes:

S1, spraying developing liquid onto the substrate 1 to be developed by the developing mechanism;

In some embodiments, the substrate 1 to be developed passes under the developing liquid outlet 31 by the transfer of the transmission component 40, the developing mechanism sprays developing liquid onto the substrate 1 by means of the developing liquid outlet 31.

S2, heating an abnormal region B of the substrate 1 to be developed by the heating mechanism 20, so that development speeds of developing regions of the substrate 1 to be developed are the same.

The abnormal region B is a pre-acquired region of the substrate 1 to be developed, this region corresponds to a region (on a substrate of the same type as the substrate 1 to be developed) within which a pattern size retained after the substrate of the same type is developed is larger than a target size, in a case where the substrate of the same type is not heated by the heating mechanism 20; that is, a region where a development speed is slow.

It should be noted that, the S2 may be executed by a person or executed by the above-mentioned control mechanism.

A development speed of the abnormal region B can be accelerated by heating it, so that development speeds of developing regions of the substrate 1 to be developed can be the same. Further, pattern sizes of developing regions retained after development are uniform, and the product quality is improved.

Figure 7:
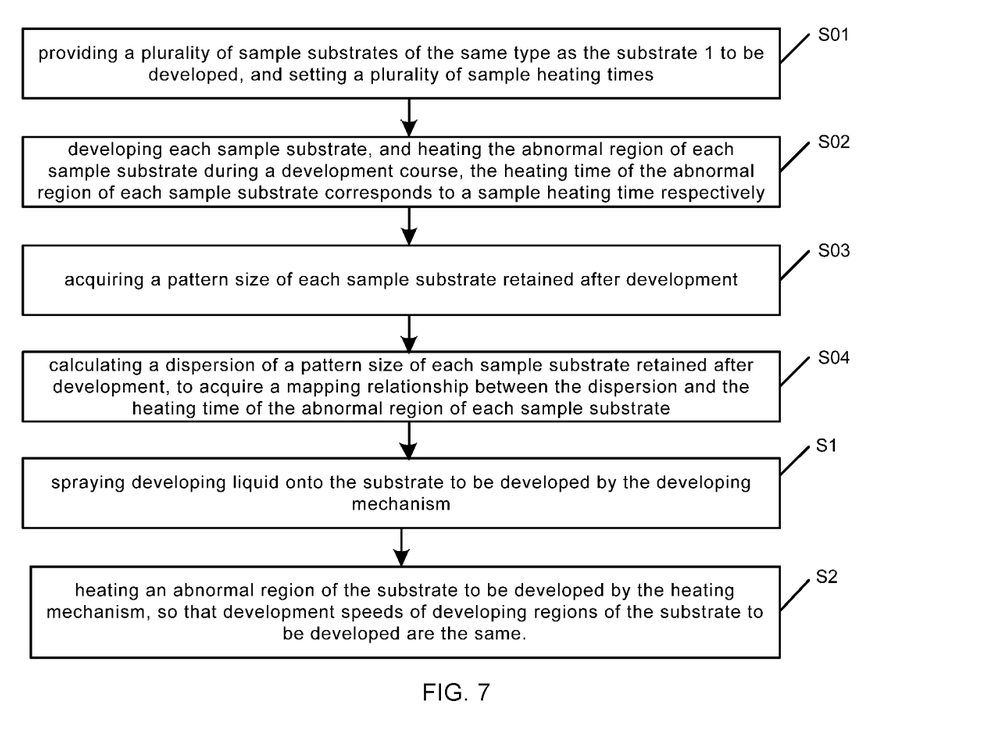
FIG. 7 is a flow chart of another developing method according to some embodiments of the present disclosure.

In some embodiments, before S2, heating the abnormal region B of the substrate 1 to be developed by the heating mechanism, as shown in FIG. 7, the developing method further includes:

S01, providing a plurality of sample substrates of the same type as the substrate 1 to be developed, and setting a plurality of sample heating times. Each sample heating time corresponds to one sample substrate.

S02, developing each sample substrate, and heating the abnormal region B of each sample substrate during a development course, the heating time of the abnormal region B of each sample substrate corresponds to a sample heating time respectively.

S03, acquiring a pattern size of each sample substrate retained after development.

S04, calculating a dispersion of a pattern size of each sample substrate retained after development, to acquire a mapping relationship between the dispersion and the heating time of the abnormal region of each sample substrate (hereinafter referred to as a mapping relationship). Taking the three times of the standard deviation of the pattern size retained after development, which is on the sample substrate of the same type as the substrate 1 to be developed, as the dispersion.

Figure 8:
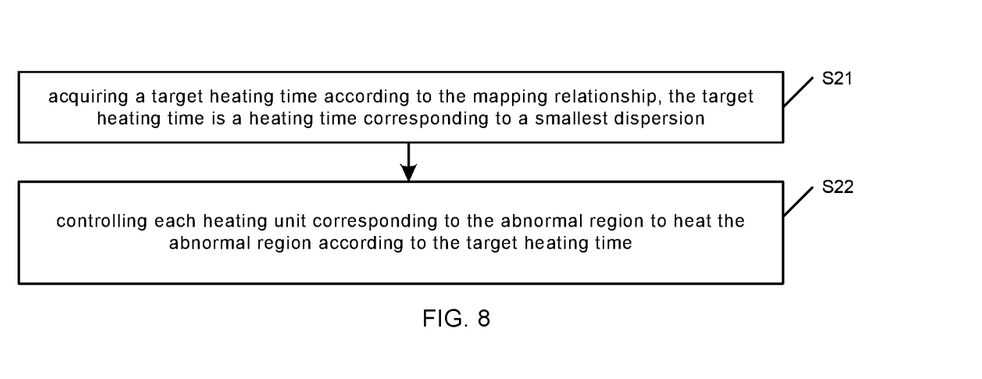
FIG. 8 is a flow chart of heating an abnormal region of a substrate to be developed by a heating mechanism according to some embodiments of the present disclosure.

In some embodiments, the developing mechanism 10 includes a transmission component 40 and a developing liquid output component 30, the developing liquid output component 30 includes a developing liquid outlet 31 disposed above the transmission component 40. The heating mechanism 20 is located above the transmission component 40, and is located on a side of the developing liquid outlet 31 in the first direction. Based on this, S2, heating the abnormal region B of the substrate 1 to be developed by the heating mechanism 20, as shown in FIG. 8 includes:

S21, acquiring a target heating time according to the mapping relationship, the target heating time is a heating time corresponding to a smallest dispersion.

S22, controlling each heating unit 21 corresponding to the abnormal region to heat the abnormal region B according to the target heating time.

Figure 9:
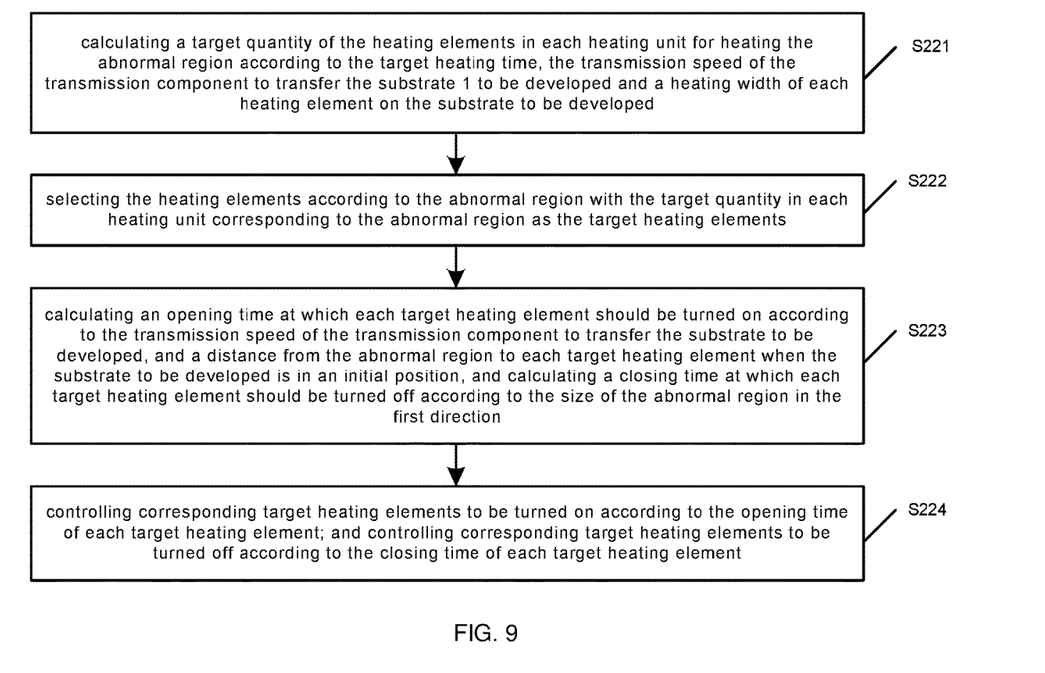
FIG. 9 is a flow chart of heating the abnormal region by controlling a heating unit in the heating mechanism according to a target heating time according to some embodiments of the present disclosure.

In some embodiments, the plurality of heating units 21 of the heating mechanism 20 are arranged in a direction cross the first direction, and each heating unit 21 includes a plurality of heating elements 211 which are arranged in the first direction. As shown in FIG. 9, the S22 includes:

S221, calculating a target quantity of the heating elements 211 in each heating unit 21 for heating the abnormal region B according to the target heating time, the transmission speed of the transmission component 40 to transfer the substrate 1 to be developed and a heating width of each heating element 211 on the substrate 1 to be developed.

The heating width is a size of the heating region of the heating element 211 on the substrate 1 to be developed in the first direction.

S222, selecting the heating elements 211 according to the abnormal region B with the target quantity in each heating unit 21 corresponding to the abnormal region B as the target heating elements.

S223, calculating an opening time at which each target heating element should be turned on according to the transmission speed of the transmission component 40 to transfer the substrate 1 to be developed, and a distance from the abnormal region B to each target heating element when the substrate 1 to be developed is in an initial position, and calculating a closing time at which each target heating element should be turned off according to the size of the abnormal region B in the first direction.

S224, controlling corresponding target heating elements to be turned on according to the opening time of each target heating element; and controlling corresponding target heating elements to be turned off according to the closing time of each target heating element.

The method of calculating the target quantity, the method of selecting the target heating element, and the method of calculating the opening and closing time of the heating element are all described above and will not be repeated herein.

The above is the description of the developing apparatus and the developing method using the developing apparatus provided by some embodiments of the present disclosure. It can be seen that, the developing apparatus provided by some embodiments of the present disclosure includes a heating mechanism 20, and one or more heating units 21 of the heating mechanism 20 may be used to heat the abnormal region (where the development speed is slow) of the substrate 1 to be developed during a development course, so as to increase the development speed of the abnormal region, and then to improve the development uniformity of different developing regions on the substrate. In addition, the heating time of the developing region may be made to reach the target heating time by controlling the heating elements 211 of one or more heating units 21 by the control mechanism 60. At the target heating time, the dispersion of the pattern size of the substrate 1 to be developed retained after development is minimized. Thereby, after the photoetching patterning process is finished, uniformity of key sizes of patterns finally obtained on the substrate is improved, and then the product quality is improved.

Steps of the method or algorithm described in some embodiments of the present disclosure may be implemented by means of executing software instructions. The software instructions may be composed by corresponding software modules, which may be stored in a random access memory (RAM), a flash memory, a read only memory (ROM), an erasable programmable ROM (EPROM), an electrically EPROM (EEPROM), a register, a hard disk, a mobile hard disk, a compact disc read only memory (CD-ROM) or any other form of storage mediums known in the art.

Hence, some embodiments of the present disclosure further provide a non-transitory computer-readable storage medium storing executable instructions to execute the developing method.

Some embodiments of the present disclosure further provide a computer program product including instructions that, when run on a computer, cause the computer to perform the developing method.

Some embodiments of the present disclosure provide a computer program that, when loaded into the processor, cause the processor to perform the developing method.

One person skilled in the art will appreciate that in one or more examples described above, the functions described herein can be implemented by hardware, software, firmware or any combination thereof. When implemented by software, the functions may be stored in a computer readable medium or transmitted as one or more instructions or codes on a computer readable medium. The computer readable medium includes both computer storage medium and communication medium, wherein, the communication medium includes any medium that facilitates the transfer of a computer program from one location to another. A storage medium may be any available medium that can be accessed by a general purpose or special purpose computer.

It should be understood that, the above embodiments are merely exemplary embodiments employed to explain the principles of the present disclosure, but the present disclosure is not limited thereto. Various modifications and improvements can be made by one person skilled in the art without departing from the spirit and scope of the present disclosure, and such modifications and improvements are also within the scope of the present disclosure.

What is claimed is:

1. A developing apparatus, comprising:
    a developing mechanism, wherein the developing mechanism is configured to develop substrate to be developed, and the developing mechanism comprises a transmission component and a developing liquid output component;
    a heating mechanism, wherein the heating mechanism comprises a plurality of heating units, each of the plurality of heating units corresponds to at least one developing region of the substrate to be developed, and different heating units correspond to different developing regions; and
    a control mechanism, wherein the control mechanism is coupled to each heating unit, and the control mechanism is configured to, when the developing mechanism develops the substrate to be developed, turn on one or more heating units corresponding to an abnormal region according to a location of the abnormal region of the substrate to be developed, so as to heat the abnormal region, wherein the abnormal region is a pre-acquired region of the substrate to be developed, and the abnormal region corresponds to a region that on a substrate of the same type as the substrate to be developed within which a pattern size retained after the substrate of the same type is developed is larger than a target size, in a case where the substrate of the same type is not heated by the heating mechanism; wherein, the plurality of heating units are provided above or below the transmission component, and each heating unit of the plurality of heating units is disposed independently;

the control mechanism comprises:

a processor, configured to acquire a target heating time according to a mapping relationship; the mapping relationship is a mapping relationship between a dispersion of pattern size retained after a sample substrate of the same type as the substrate to be developed is developed and a heating time of an abnormal region of the sample substrate; the target heating time is a heating time corresponding to a smallest dispersion;

a memory, configured to store the mapping relationship;

a timer, configured to control each heating unit corresponding to the abnormal region to heat the abnormal region according to the target heating time.

2. The developing apparatus according to claim 1, wherein, the transmission component is configured to transfer the substrate to be developed;

the developing liquid output component comprises a developing liquid outlet, the developing liquid outlet is disposed above the transmission component, and is configured to spray developing liquid onto the substrate to be developed which is located on the transmission component; and the heating mechanism is located above the transmission component, and is located on a side of the developing liquid outlet in a first direction; the first direction is a direction in which the transmission component transfers the substrate to be developed.

3. The developing apparatus according to claim 1, wherein, the plurality of heating units are arranged in a direction cross the first direction, and each heating unit comprises a plurality of heating elements which are arranged in the first direction; the first direction is a direction in which the transmission component transfers the substrate to be developed;

the timer is further configured to:

calculate a target quantity of the heating elements in each heating unit for heating the abnormal region according to the target heating time, a transmission speed of the transmission component to transfer the substrate to be developed and a heating width of each heating element on the substrate to be developed;

wherein, the heating width is a size of a heating region of the heating element on the substrate to be developed in the first direction;

select, according to the abnormal region, the heating elements with the target quantity in each heating unit corresponding to the abnormal region as the target heating elements.

4. The developing apparatus according to claim 3, wherein, the timer is further configured to: calculate an opening time at which each target heating element should be turned on according to the transmission speed of the transmission component to transfer the substrate to be developed and a distance from the abnormal region to each target heating element when the substrate to be developed is in an initial position; and calculate a closing time at which each target heating element should be turned off according to a size of the abnormal region in the first direction;

the timer further comprises a switch, and the switch is configured to control corresponding target heating elements to be turned on according to the opening time of each target heating element; and control corresponding target heating elements to be turned off according to the closing time of each target heating element.

5. The developing apparatus according to claim 4, wherein, the initial position is located on a side of the developing liquid outlet opposite to the first direction;

the developing apparatus further comprises a position detecting device, which is configured to detect whether the substrate to be developed arrives the initial position.

6. The developing apparatus according to claim 3, wherein, the heating element is an infrared radiation lamp.

7. The developing apparatus according to claim 1, wherein, the processor is further configured to:

set a plurality of sample heating times in advance, each sample heating time corresponds to one sample substrate of the same type as the substrate to be developed;

acquire a pattern size of each sample substrate retained after development; wherein, during a development course of each sample substrate the abnormal region of each sample substrate is heated, and the heating time of the abnormal region of each sample substrate corresponds to a sample heating time respectively;

calculate a dispersion of the pattern size of each sample substrate retained after development according to the acquired pattern size, so as to acquire the mapping relationship.

8. A developing method of the developing apparatus according to claim 1, comprising:

spraying, by the developing mechanism, developing liquid onto the substrate to be developed; and heating, by the heating mechanism, an abnormal region of the substrate to be developed, so that development speeds of developing regions of the substrate to be developed are the same, wherein the step of heating the abnormal region of the substrate to be developed comprises:

acquiring a target heating time according to a mapping relationship; the mapping relationship is a mapping relationship between a dispersion of pattern size retained after a sample substrate of the same type as the substrate to be developed is developed and a heating time of the abnormal region of the sample substrate; the target heating time is a heating time corresponding to a smallest dispersion; and controlling each heating unit corresponding to the abnormal region to heat the abnormal region according to the target heating time.

9. The developing method according to claim 8, wherein, the developing liquid output component comprises a developing liquid outlet, the developing liquid outlet is disposed above the transmission component; the heating mechanism is disposed above the transmission component, and is located on a side of the developing liquid outlet in the first direction.

10. The developing method according to claim 9, wherein, the plurality of heating units of the heating mechanism are arranged in a direction cross the first direction, and each heating unit comprises a plurality of heating elements which are arranged in the first direction;

controlling each heating unit corresponding to the abnormal region to heat the abnormal region according to the target heating time comprises:

calculating a target quantity of the heating elements in each heating unit for heating the abnormal region according to the target heating time, the transmission speed of the transmission component to transfer the substrate to be developed and a heating width of each heating element on the substrate to be developed$[N]_z$ wherein, the heating width is a size of a heating region of the heating element on the substrate to be developed in the first direction;

selecting, according to the abnormal region, the heating elements with the target quantity in each heating unit corresponding to the abnormal region as the target heating elements;

calculating an opening time at which each target heating element should be turned on according to the transmission speed of the transmission component to transfer the substrate to be developed and a distance from the abnormal region to each target heating element when the substrate to be developed is in an initial position; and calculating a closing time at which each target heating element should be turned off according to a size of the abnormal region in the first direction; and     controlling corresponding target heating elements to be turned on according to the opening time of each target heating element; and controlling corresponding target heating elements to be turned off according to the closing time of each target heating element.

11. The developing method according to claim 10, wherein, before heating the abnormal region of the substrate to be developed by the heating mechanism, the developing method further comprises:

providing a plurality of sample substrates of the same type as the substrate to be developed, and setting a plurality of sample heating times, each sample heating time corresponds to one sample substrate;

developing each sample substrate, and heating the abnormal region of each sample substrate during a development course, the heating time is a sample heating time corresponding to the abnormal region of each sample substrate;

acquiring a pattern size of each sample substrate retained after development;

calculating a dispersion of the pattern size of each sample substrate retained after development, so as to acquire the mapping relationship.

12. A non-transitory computer-readable storage medium storing computer instructions executed by a processor, wherein, the computer instructions are configured to execute the developing method according to claim 8.

* * * * *